(12) United States Patent
Hu et al.

(10) Patent No.: US 6,444,544 B1
(45) Date of Patent: Sep. 3, 2002

(54) METHOD OF FORMING AN ALUMINUM PROTECTION GUARD STRUCTURE FOR A COPPER METAL STRUCTURE

(75) Inventors: Chu-Wei Hu, Hsin-Chu; Chung-Te Lin, Tainan; Kuo-Hua Pan, Taichung; Hsien-Chin Lin, Hsin-Chu, all of (TW)

(73) Assignee: Taiwan Semiconductor Manufacturing Company, Hisin-chu (TW)

( * ) Notice: Subject to any disclaimer, the term of this patent is extended or adjusted under 35 U.S.C. 154(b) by 135 days.

(21) Appl. No.: 09/629,940

(22) Filed: Aug. 1, 2000

(51) Int. Cl.$^7$ .................. H01L 21/326; H01L 21/82; H01L 21/44
(52) U.S. Cl. ............... 438/467; 438/132; 438/601
(58) Field of Search ............... 438/128, 132, 438/597, 601, 687, 688, 710, 720, 712, 73, 80, 89, 467, 470, 333; 327/525; 365/96, 200

(56) References Cited

U.S. PATENT DOCUMENTS

| | | | |
|---|---|---|---|
| 5,926,697 A | 7/1999 | Yaung et al. | 438/132 |
| 5,970,346 A | 10/1999 | Liaw | 438/281 |
| 6,008,075 A | 12/1999 | Lieu | 438/132 |
| 6,294,474 B1 * | 9/2001 | Tzeng et al. | 438/710 |

* cited by examiner

Primary Examiner—Caridad Everhart
Assistant Examiner—Calvin Lee
(74) Attorney, Agent, or Firm—George O. Saile; Stephen B. Ackerman

(57) ABSTRACT

A method of forming aluminum guard structures in copper interconnect structures, used to protect the copper interconnect structures from a laser write procedure, performed to an adjacent copper fuse element, has been developed. The method features forming guard structure openings in an upper level of the copper interconnect structures, in a region adjacent to a copper fuse element. Deposition and patterning of an aluminum layer result in the formation of aluminum guard structures, located in the guard structure openings. The aluminum guard structures protect the copper interconnect structures from the oxidizing and corrosive effects of oxygen, fluorine and water ions, which are generated during a laser write procedure, performed to the adjacent copper fuse element.

23 Claims, 5 Drawing Sheets

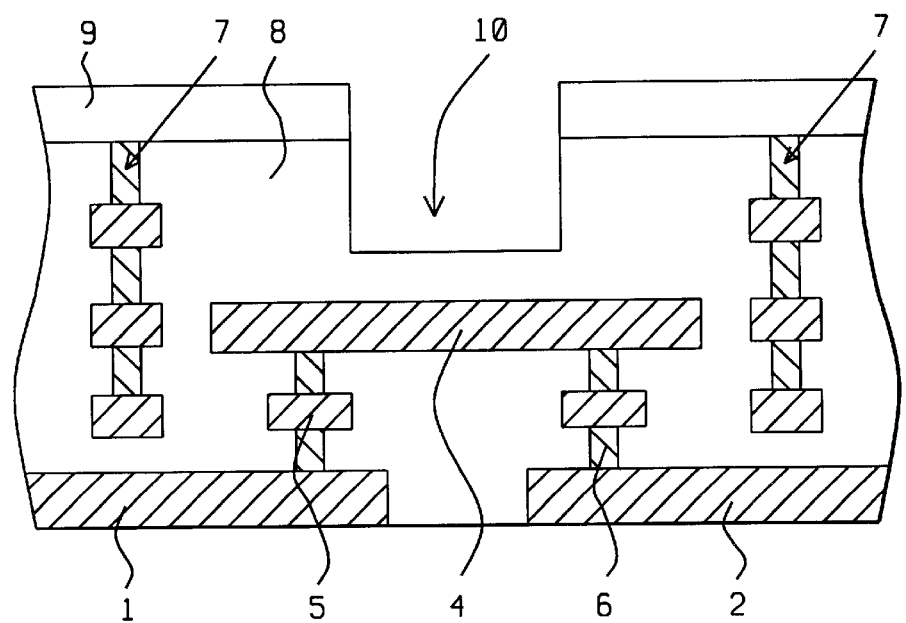
FIG. 1 – Prior Art
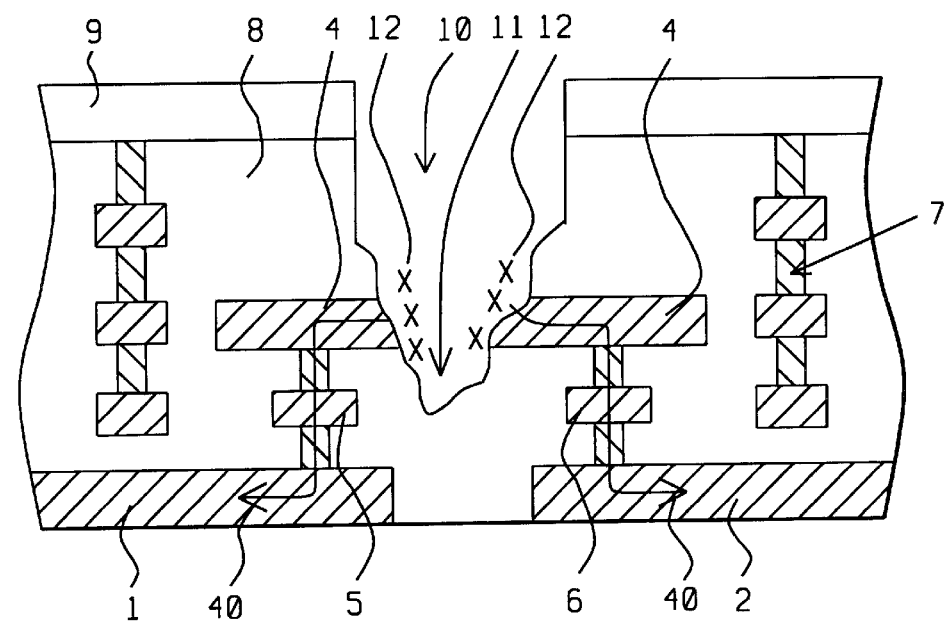
FIG. 2 – Prior Art

METHOD OF FORMING AN ALUMINUM PROTECTION GUARD STRUCTURE FOR A COPPER METAL STRUCTURE

BACKGROUND OF THE INVENTION (1) Field of the Invention

The present invention relates to a method used to retard corrosion of copper structures resulting from a laser write procedure, performed to an adjacent copper fuse element (2) Description of Prior Art Fuse elements have been used to allow defective regions, such as a defective gate array located in a body gate arrays, to be deleted, and sometimes replaced by another non-defective gate array. This is accomplished via use of fuse elements, placed between specific gate arrays, allowing defective regions to be removed from the main body of gate array regions, by 'blowing' of, or opening of, the fuse element. This results in physical, as well as electrical discontinuity of the defective gate array region, in regards to the main body of devices. The use of copper for metal interconnect, and for metal via plug structures, conveniently allow the fuse element to also be fabricated from a copper layer. However the laser writing, or the procedure use to open or blow the copper fuse element, can result in degradation to the adjacent copper structures, in terms of oxidation or corrosion. The laser writing procedure produces oxygen, water, and fluorine ions, which will corrode, as well as oxidize the copper interconnect structure of nearby gate array elements, resulting in yield loss due to the reduced conductivity of the oxidized copper structures. The oxidation and corrosion phenomena can also impact reliability of the structures, in regards to electromigration. In addition the oxygen, water, and fluorine ions, incorporated in the copper interconnect structures, can during subsequent temperature excursions propagate and extend into the low resistivity copper interconnects, resulting in extensive conductivity, and performance, decreases.

This invention will describe a process, and structure, in which an aluminum guard structure is formed at a location in the copper interconnect structure that will prevent propagation of the corrosive effect of the laser writing from deleteriously influencing the copper interconnect structures. Prior art, such as Liaw, in U.S. Pat. No. 5,970,346, as well as Lien et al, in U.S. Pat. No. 6,008,075, describe guard rings, and metal guard spacers, near the fuse structure, but these prior arts do not show the concept or details of the present invention, featuring the fabrication and placement of a corrosion retarding aluminum guard structure, in a copper interconnect structure, in a region adjacent to the copper fuse element.

SUMMARY OF THE INVENTION

It is an object of this invention to fabricate a copper fuse element, located between bodies of array devices, comprised with copper interconnect, back end of line, (BEOL), wiring.

It is another object of this invention to integrate the fabrication of an aluminum guard structure, placed adjacent to the copper fuse element, with the fabrication sequence used for copper BEOL interconnect structure.

It is still another object of this invention to form the aluminum guard structure in each body of gate arrays, or device elements, with each aluminum guard structure located as part of an upper level of a copper interconnect structure, adjacent to the copper fuse element.

In accordance with the present invention a method of forming an aluminum guard structure, as part of a copper interconnect, to retard the oxidation and corrosion effects of a laser write procedure, performed to an adjacent copper fuse element, is described. Multi-level, metal interconnect structures, comprised of levels of copper interconnect shapes, and copper plug structures, are formed in insulator layers, electrically and physically connecting underlying device regions in a semiconductor substrate, to a subsequent wire bond, or flip chip pad. Specific multi-level metal interconnect structures are used for communication to specific arrays of devices. During the fabrication of the multi-level metal interconnect structures a copper fuse element is simultaneously formed, physically and electrically connecting a first multi-level metal interconnect structure to a main body of arrays, via connection to second multi-level metal interconnect structure. In addition a protection ring, comprised of copper interconnect, and plug shapes, is simultaneously fabricated during formation of the multi-level copper interconnect structures. Patterning procedures are then employed to form a laser write via hole in a top portion of an insulator layer, resulting in a bottom portion of the insulator layer directly overlying the copper fuse element. The same patterning procedure is used to form a guard structure opening in the insulator layer, and in an each multi-level copper interconnect structure. Deposition of an aluminum layer and subsequent patterning procedures, result in the formation of aluminum guard structures, located as part of the multi-level copper interconnect structures, located near the copper fuse element, used to prevent oxidation and corrosion of the multi-level copper interconnect structures, during a laser write procedure applied to the copper fuse element performed in the laser write via hole..

BRIEF DESCRIPTION OF THE DRAWINGS

The object and other advantages of this invention are best described in the preferred embodiments with reference to the attached drawings that include:

FIGS. 1–2, which schematically in cross-sectional style, show prior art, in which multi-level copper interconnect structures are directly connected to a copper fuse element.

DESCRIPTION OF THE PREFERRED EMBODIMENTS

Figure 3:
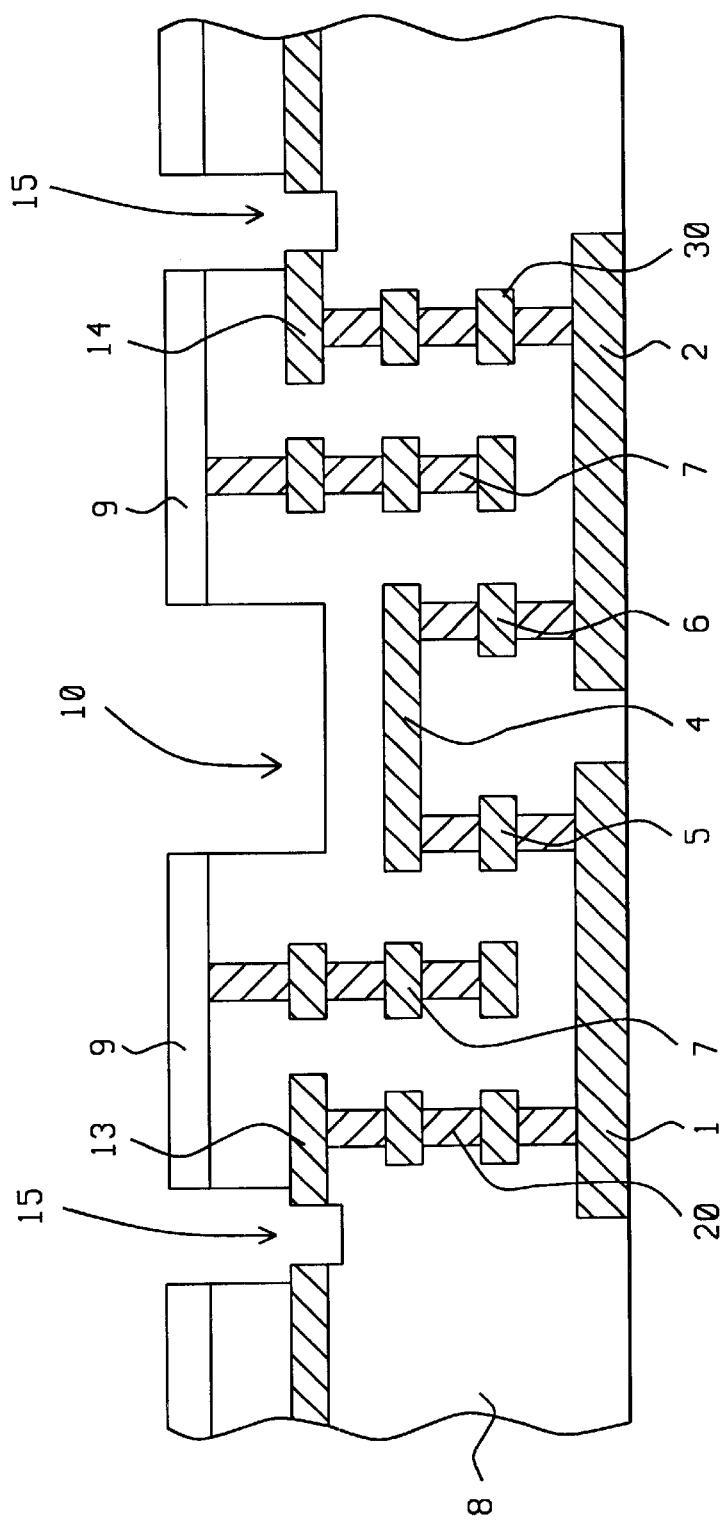
FIGS. 3, 4B, and 5, which schematically in cross-sectional style, show key stages of fabrication used to form a aluminum guard structure in a multi-level copper interconnect structure, to protect the multi-level copper interconnect structures from the corrosive and oxidizing effects of a laser write procedure, performed to the adjacent copper fuse element.

The method of forming an aluminum guard structure, as part of an upper portion of a multi-level copper interconnect structure, used to prevent oxidation and corrosion of the multi-level copper interconnect structure during a laser write procedure applied to a connected, and adjacent, copper fuse structure, will now be described in detail. FIGS. 1–2, schematically, in cross-sectional style, show prior art, or a method of fabrication of a fuse element structure connected to multi-level copper interconnect structures, however without the principal feature of this present invention, an aluminum guard structure incorporated as part of the multi-level copper interconnect structure. Lower level copper interconnect structures 1, and 2, shown schematically in FIG. 1, are electrically and physically connected to copper fuse element 4, via copper interconnect structures 5, and 6. Lower level copper interconnect structures 1, and 2, communicate with underlying semiconductor devices, or arrays of devices, (not shown in the drawings). Multi-level copper interconnect structures 5, and 6, are formed via conventional metal, (copper), and insulator deposition and patterning procedures, resulting in copper interconnect shapes, connected by narrow copper plug structures. Copper depositions are achieved using either chemical vapor deposition, plasma vapor deposition, of electroplating procedures, while copper patterning is accomplished using either a chemical mechanical polishing procedure, or photolithographic and dry etching procedures, such as a reactive ion etching procedure, using $Cl_2$ or $SF_6$ as an etchant for copper. Insulator layer 8, in which lower level copper interconnect structures 1, and 2, multi-level copper interconnect structures 5, and 6, and copper fuse element 4, are encapsulated in, is comprised of either levels of silicon oxide, or borophosphosilicate glass, obtained via plasma enhanced chemical vapor deposition procedures. An alternative to conventional metal deposition and patterning procedures, can be damascene type opening formed in insulator layer 8, followed by deposition of, and chemical mechanical polishing of, copper layers, resulting in the damascene type copper shapes of multi-level copper interconnect structures 5, and 6. This is schematically shown in FIG. 1.

Copper fuse element 4, schematically shown in FIG. 1, is next formed physically connecting multi-level copper interconnect structure 5, to multi-level copper interconnect structure 6. Each combination of a multi-level copper interconnect structure, and underlying lower level copper interconnect structure communicate with underlying devices, so if a specific array region needs to be deleted, or disconnected from another group of arrays, fuse region 4, has to be destroyed, or rendered discontinuous. Copper fuse element 4, is obtained by creating an opening, between about 0 to 30,000 Angstroms in depth, in insulator layer 8, via conventional photolithographic and dry etching procedures. A deposition of a copper layer, at a thickness between about 2500 to 10,000 Angstroms, is next made via a procedure such as chemical vapor deposition, plasma vapor deposition, or electroplating, followed by removal of unwanted regions of copper from the top surface of the insulator layer via a chemical mechanical polishing procedure, creating the damascene type, copper fuse element 4. After formation of copper fuse element 4, another insulator is deposited, and is regarded as part of insulator 8. In addition protection ring 7, comprised of various levels of copper interconnect, and copper plug structures, is simultaneously formed with the specific procedures used to form multi-level copper interconnect structures 5, and 6, and copper fuse element 4. Protection ring 7, shown schematically in FIG. 1, is used to protect adjacent regions of the semiconductor chip from a subsequent laser write procedure. However the use of protection ring 7, does not preclude the use of the aluminum guard structure, of this present invention, used to prevent oxidation and corrosion of multi-level copper interconected structure during the same laser write procedure. After deposition of insulator layer 9, comprised of either silicon oxide, or borophosphosilicate glass, obtained via plasma enhanced chemical vapor deposition procedures, laser write via hole 10, is formed trhough insulator layer 9, and in a first portion insulator layer 8, exposing the top surface of fuse element 4, still covered by a second portion of insulator layer 8. Laser write via hole is formed via conventional photolithographic and dry etching procedures, using $CHF_3$ as an etchant for the insulator layers.

The programing, or deletion of a specif array of devices, is accomplished via laser write procedure performed at wavelenght between about 800 to 1500 nm, at an energy between about 0.2 to 1.5 microjoules. the laser write procedure performed in laser write opening 10, results in a discontinuity of cooper fuse element 4, thus removing a group of array devices, such as the array devices accessed by multi-level copper interconected structure 6, from a main group of array devices, accessed by multi-level copper interconneted structure 5. However the severity and conditions of the laser write procedures results in the evolution of oxigen, fluorine, and water ions 12, which can in turn oxidize and corrode exposed regions 11, of multi-level copper interconnect structure 5. The unwanted oxidation and corrosion phenomena can extend through multi-level copper interconnect structure 5, reaching lower level copper interconnect structure, at a point labelled 40, as shown in the prior art of FIG. 2. The propagation of the unwanted oxidation and corrosion of copper occurs during subsequent processing, performed at temperatures between about 200 to 400° C. The result of this phenomena is decreased chip performance resulting from the loss of copper conductivity, resulting from oxidation, as well as reliability concerns, in terms of electromigration, resulting from increased current density through the partially corroded or oxidized copper structures.

A process, and structure, employed to prevent the deleterious oxidation and corrosion effects of a laser write procedure will now be described. FIG. 3, schematically shows the creation of multi-level copper interconnect structures 20, and 30, that will physically and electrical connect to copper fuse element 4. Multi-level copper interconnect structures 20, and 30, are designed to extend upwards to allow connection to overlying copper structures 13, and 14, which in turn can be subsequently addressed by procedures used to form wire pad openings in insulator layers 8, and 9. Multi-level copper interconnect structures 20, and 30, as well as overlying copper structures 13, and 14, are again formed via conventional metal, (copper), and insulator deposition and patterning procedures, resulting in copper interconnect shapes, connected by narrow copper plug structures. Not shown in the drawings is the physical and electrical path from copper structures 13, and 14, to underlying groups of array devices, accomplished again via creation of multi-level copper interconnect structures formed simultaneously with multi-level copper interconnect structures 20, and 30. Copper depositions are again achieved using either chemical vapor deposition, plasma vapor deposition, of electrochemical plating procedures, while copper patterning is accomplished using either a chemical mechanical procedure, or photolithographic and dry etching procedures. At this point a photoresist shape, (not shown in the drawings), is used as an etch mask, to allow a reactive ion etching, (RIE), procedure, using $CHF_3$ as an etchant for insulator layers 9, and 8, and $Cl_2$ or $SF_6$ as an etchant for copper structures 13, and 14, to define wire bond pad, or metal guard structure openings 15. This is schematically shown in FIG. 3.

Figure 4A:
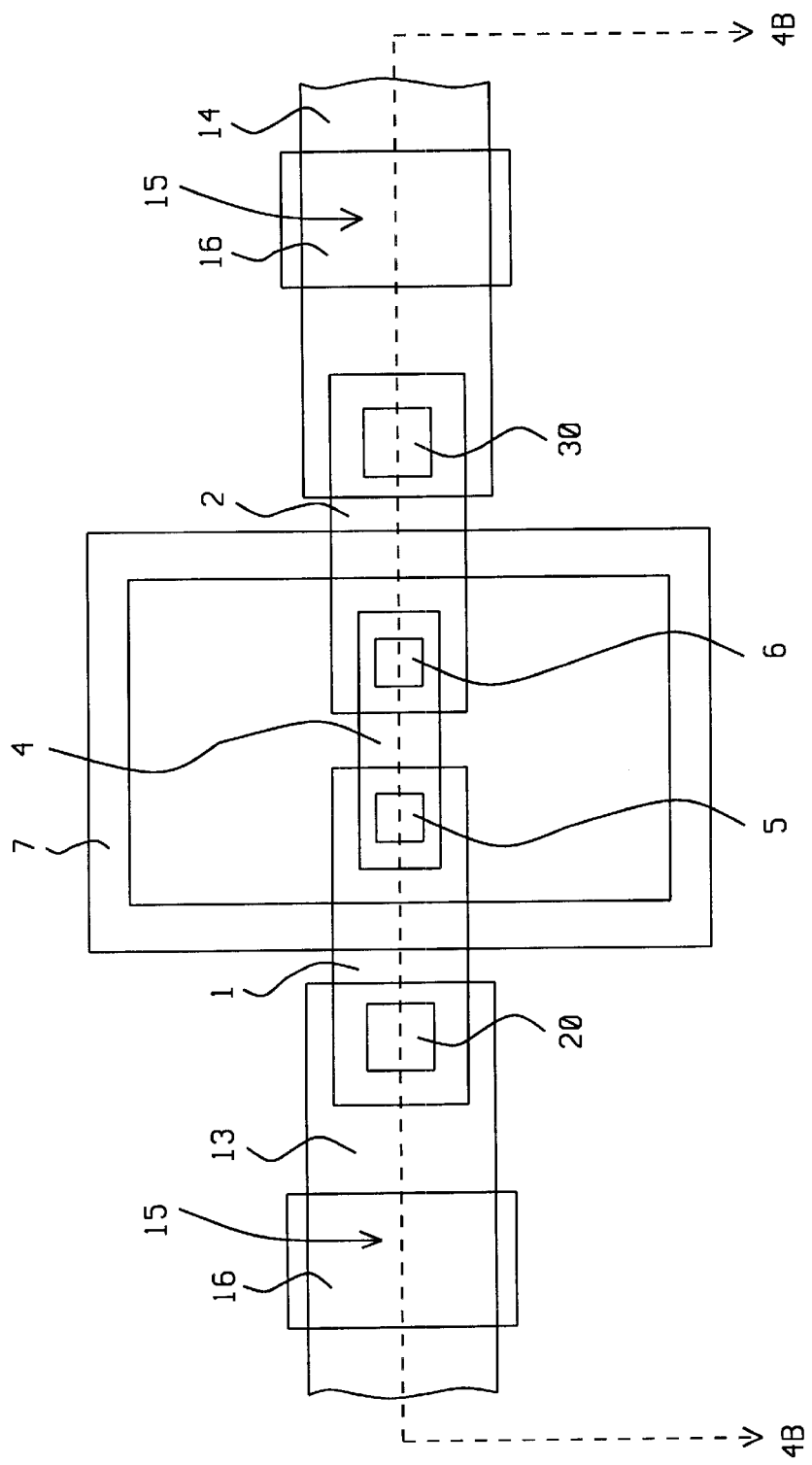
FIG. 4A, which schematically shows a top view of the aluminum guard structure, in a multi-level copper interconnect structure, located near the copper fuse element.
Figure 4B:
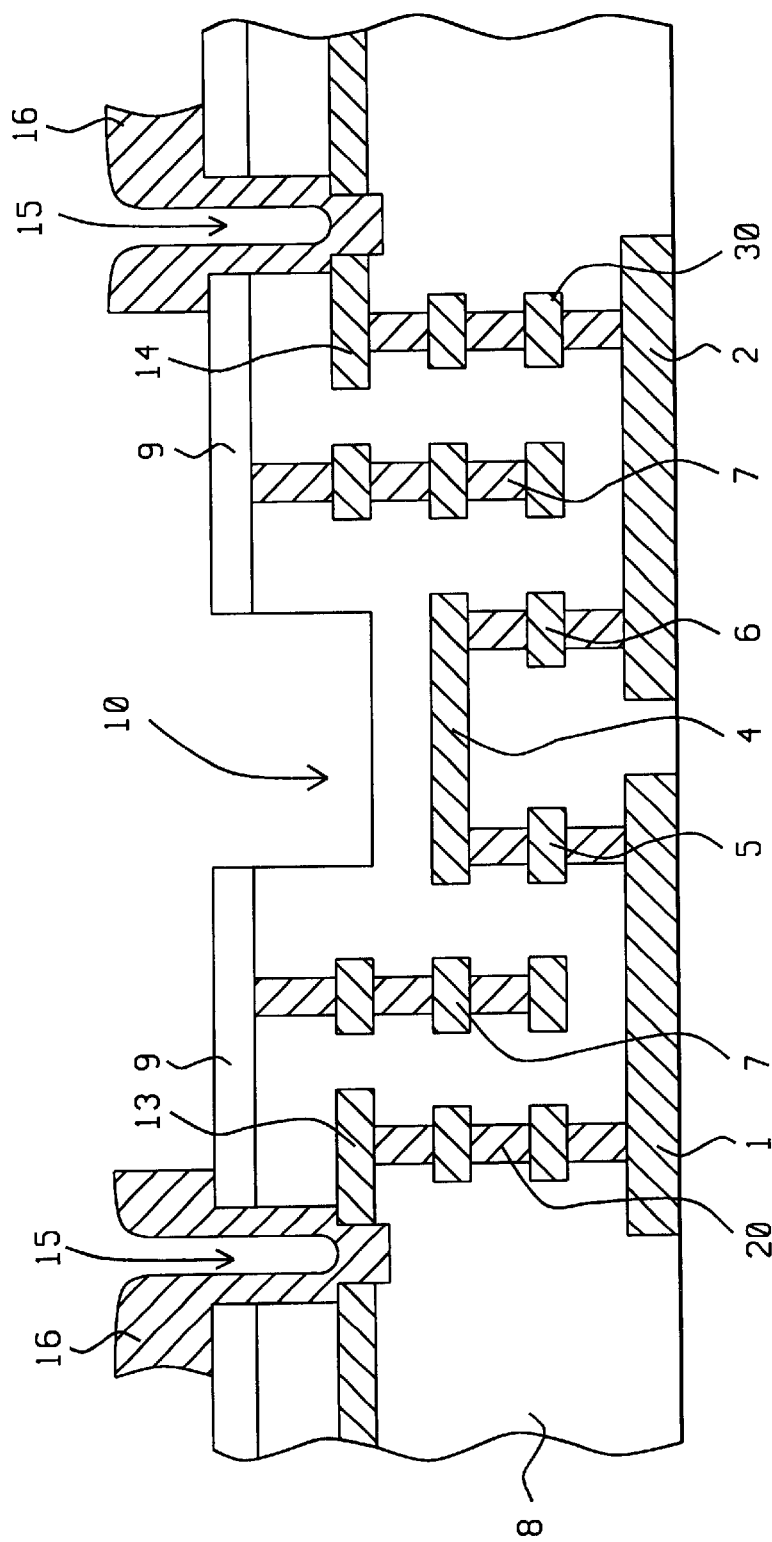

After removal of the photoresist shape, used to create metal guard structure openings 15, an aluminum layer is deposited via plasma vapor deposition, (PVD), procedures, to a thickness between about 5000 to 20,000 Angstroms. Another photoresist shape, (not shown in the drawings), is then used as a mask to allow a RIE procedure, using $Cl_2$ or $SF_6$ as an etchant for aluminum, to define aluminum guard structures 16, in wire bond pad openings 15. This is schematically shown in cross-sectional style in FIG. 4B, as well as schematically as a top view in FIG. 4A. The photoresist shape used for definition of aluminum guard structures 16, is then removed.

Figure 5:
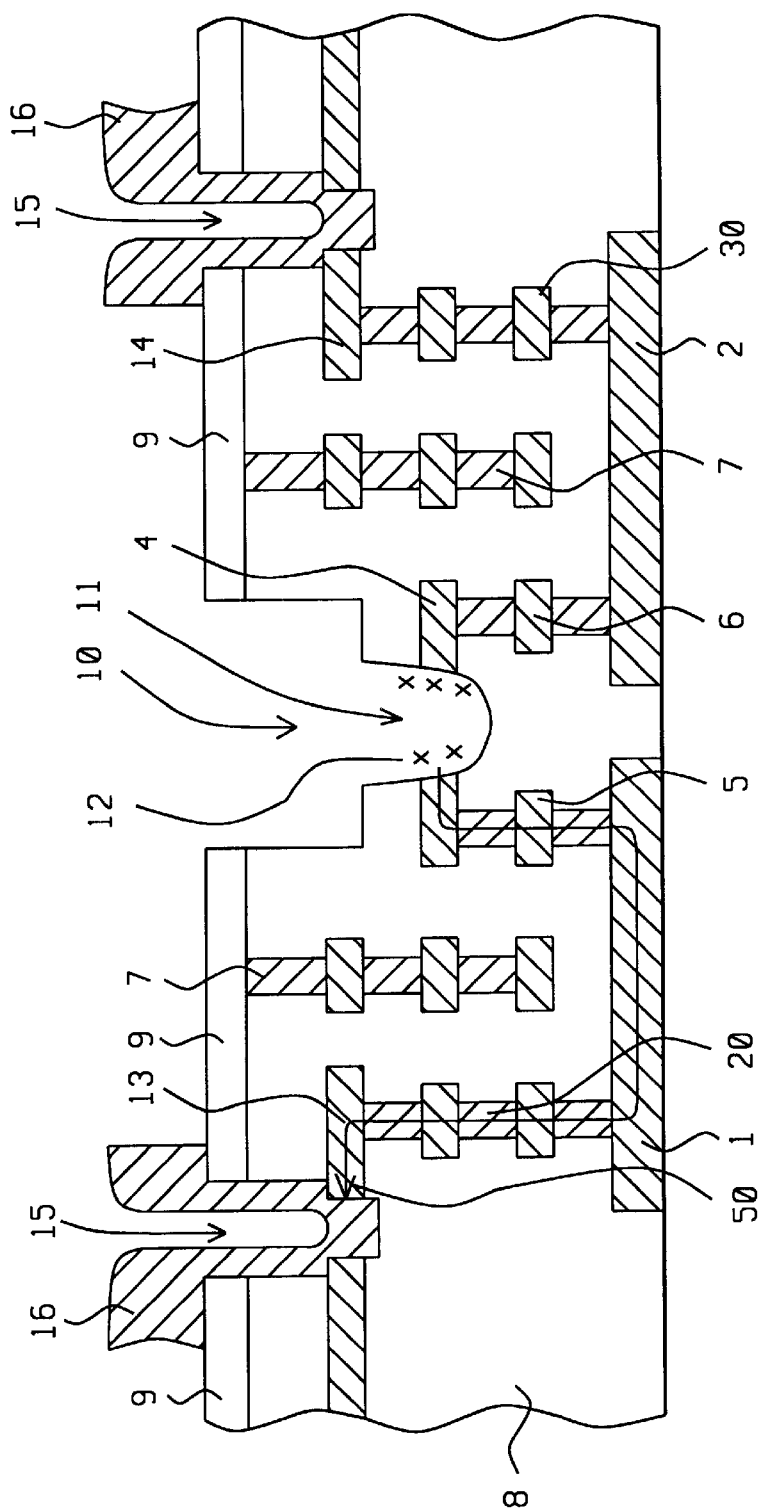

The oxidizing and corroding species, generated by the laser write procedure, which deleteriously react with exposed copper, do not oxidize or corrode aluminum. Therefore the placement of aluminum guard structures 16, near copper fuse element 4, protects the multi-level copper interconnect structures from this deleterious reaction. The effect of a laser write procedure, applied to a copper fuse element, in a configuration that includes aluminum guard structures 16, is schematically shown in FIG. 5. Again oxidizing and corrosive ions 12, are present as a result of the laser write program, however in this case the oxidation and corrosion of copper structure 13, terminates at point 50, at the interface of aluminum guard structure 16, thus protecting the integrity of multi-level copper interconnect structures along the entire length of the multi-level copper interconnect structure, from the aluminum guard structure to the underlying devices in the semiconductor substrate.

While this invention has been particularly shown and described with reference to, the preferred embodiments thereof, it will be understood by those skilled in the art that various changes in form and details may be made without departing from the spirit and scope of this invention.

What is claimed is:

1. A method of incorporating a metal guard structure in a multi-level metal interconnect structure, on a semiconductor substrate, with said metal guard structure formed adjacent to a metal fuse element, comprising the steps of:

forming a first multi-level metal interconnect structure in a first insulator layer, contacting a first group of array devices, located in said semiconductor substrate, and simultaneously forming a second multi-level metal interconnect structure in said first insulator layer, contacting a second group of array devices, located in said semiconductor substrate, forming said metal fuse element in said first insulator layer, connecting said first multi-level metal interconnect structure, to said second multi-level metal interconnect structure;

depositing a second insulator layer;

forming a first opening in said second insulator layer, and in a top portion of said first insulator layer, exposing a bottom portion of said first insulator layer in a region in which said bottom portion of said first insulator layer is located overlying a top surface of said metal fuse element;

forming a second opening in said second insulator layer, in said top portion of said first insulator layer, and in said first multi-level metal interconnect structure, and simultaneously forming a third opening in said second insulator layer, in said top portion of said first insulator layer, and in said second multi-level metal interconnect structure; and forming a first metal guard structure in said second opening, and simultaneously forming a second metal guard structure in said third opening.

2. The method of claim 1, wherein said first insulator layer is comprised of silicon oxide, or of borophosphosilicate glass.

3. The method of claim 1, wherein said first multi-level metal interconnect structure, and said second multi-level metal interconnect structure, are comprised of copper interconnect shapes, and copper via plug shapes, formed via deposition of a copper layer, which is obtained via either chemical vapor deposition, using plasma vapor deposition, or electroplating procedures, then followed by a patterning procedure, featuring photolithography and reactive ion etching, using $Cl_2$ or $SF_6$ as an etchant.

4. The method of claim 1, wherein the copper interconnect shapes, and copper via plug shapes, of said first multi-level metal interconnect structure, and of said second multi-level metal interconnect structure, are formed via a damascene procedure featuring openings made in a first insulator layer, deposition of a copper layer, and removal of unwanted regions of copper via a chemical mechanical polishing procedure.

5. The method of claim 1, wherein said metal fuse element is a damascene type, copper fuse element, obtained via opening a hole in said first insulator layer, at a depth between about 0 to 30,000 Angstroms, then depositing a copper layer to a thickness between about 2500 to 10,000 Angstroms, using either chemical vapor deposition, plasma vapor deposition, or electroplating procedures, followed by a chemical mechanical polishing procedure.

6. The method of claim 1, wherein said second insulator layer is comprised of silicon oxide, or borophosphosilicate glass.

7. The method of claim 1, wherein said first opening is a laser write opening, formed in said second insulator layer, and in a top portion of said first insulator layer, via photolithographic and reactive ion etching procedures, using $CHF_3$ as an etchant for the insulator layers.

8. The method of claim 1, wherein said second opening, and said third opening, are metal guard structure openings, formed in said second insulator layer, in a top portion of said first insulator layer, and in the multi-level metal level interconnect structures, via photolithographic and reactive ion etching procedures, using $CHF_3$ as an etchant for the insulator layers, while using either $Cl_2$ or $SF_6$ as an etchant for the multi-level metal interconnect structures.

9. The method of claim 1, wherein said first metal guard structure, and said second metal guard structure, are comprised of aluminum, obtained via plasma vapor deposition, at a thickness between about 5000 to 20,000 Angstroms, and defined via photolithographic and reactive ion etching procedures, using either $Cl_2$ or $SF_6$ as an etchant.

10. A method of forming aluminum metal guard structures in a multi-level copper interconnect structures, on a semiconductor substrate, with said aluminum guard structures formed adjacent to a copper fuse element, comprising the steps of:

forming a first multi-level copper interconnect structure in a first insulator layer, contacting a first group of array devices located in said semiconductor substrate, and simultaneously forming a second multi-level copper interconnect structure in said first insulator layer, contacting a second group of array devices located in said semiconductor substrate, wherein said first multi-level copper interconnect structure, and said second multi-level copper interconnect structure are comprised with copper interconnect shapes, and copper via plug shapes;

forming said copper fuse element in said first insulator layer, connecting said first multi-level copper interconnect structure to said second multi-level copper interconnect structure;

depositing a second insulator layer;

forming a laser write opening in said second insulator layer, and in a top portion of said first insulator layer, exposing a bottom portion of said first insulator layer in a region in which said bottom portion of said first insulator layer is located overlying a top surface of said copper fuse element;

forming a first opening in said second insulator layer, in said top portion of said first insulator layer, and in said first multi-level copper interconnect structure, and simultaneously forming a second opening in said second insulator layer, in said top portion of said first insulator layer, and in said second multi-level copper interconnect structure;

depositing an aluminum layer; and patterning of said aluminum layer to form a first aluminum guard structure in said first opening, and simultaneously forming a second aluminum guard structure in said second opening.

11. The method of claim 10, wherein said first insulator layer is comprised of silicon oxide, or of borophosphosilicate glass.

12. The method of claim 10, wherein said copper interconnect shapes, and copper via plug shapes, of said first multi-level copper interconnect structure, and of said second multi-level copper interconnect structure, are formed via deposition of a copper layer, obtained via either chemical vapor deposition, using plasma vapor deposition, or of electroplating procedures, followed by a patterning procedure, featuring photolithography and reactive ion etching, using $Cl_2$ or $SF_6$ as an etchant.

13. The method of claim 10, wherein said copper interconnect shapes, and copper via plug shapes, of said first multi-level copper interconnect structure, and of said second multi-level copper interconnect structure, are formed via a damascene procedure featuring openings in first insulator layer, deposition of a copper layer, and removal of unwanted regions of copper via a chemical mechanical polishing procedure.

14. The method of claim 10, wherein said copper fuse element is a damascene type, copper fuse element, obtained via opening a hole in said first insulator layer, at a depth between about 0 to 30,000 Angstroms, then depositing a copper layer to a thickness between about 2500 to 10,000 Angstroms, using either chemical vapor deposition, plasma vapor deposition, or electroplating procedures, followed by a chemical mechanical polishing procedure.

15. The method of claim 10, wherein said second insulator layer is comprised of silicon oxide, or of borophosphosilicate glass.

16. The method of claim 10, wherein said laser write opening is formed in said second insulator layer, and in a top portion of said first insulator layer, via photolithographic and reactive ion etching procedures, using $CHF_3$ as an etchant for the insulator layers.

17. The method of claim 10, wherein said first opening, and said second opening, are metal guard structure openings, formed in said second insulator layer, in a top portion of said first insulator layer, and in the multi-level metal level interconnect structures, via photolithographic and reactive ion etching procedures, using $CHF_3$ as an etchant for the insulator layers, while using either $Cl_2$ or $SF_6$ as an etchant for the multi-level copper interconnect structures.

18. The method of claim 10, wherein said aluminum layer is obtained via plasma vapor deposition procedures, to a thickness between about 5000 to 20,000 Angstroms.

19. The method of claim 10, wherein said first aluminum guard structure, and said second aluminum guard structure, are defined via photolithographic and reactive ion etching procedures, using either $Cl_2$ or $SF_6$ as an etchant.

20. Metal guard structures, on a semiconductor substrate, located in multi-level copper interconnect structures, and located adjacent to a copper fuse element, comprising:

multi-level copper interconnect structures, in a composite insulator layer, with each multi-level copper interconnect structure connected to a group of underlying device elements, in said semiconductor substrate;

said copper fuse element in said composite insulator layer, located between said multi-level copper interconnect structures;

a laser write opening in a top portion of said composite insulator layer, exposing a lower portion of said composite insulator layer, with said lower portion of said composite insulator layer, exposed in said laser write opening, located on a top surface of said copper filse element;

metal guard openings in said top portion of said composite insulator layer, and in said multi-level copper interconnect structures, with said metal guard openings located adjacent to said copper fuse structure;

said metal guard structures in said metal guard openings; and a protection ring in said composite insulator layer, surrounding said copper fuse structure, located between said copper fuse structure and said metal guard structures.

21. The metal guard structures of claim 20, wherein the thickness of said copper fuse element is between about 0 to 30,000 Angstroms.

22. The metal guard structures of claim 20, wherein said metal guard structures are comprised of aluminum, at a thickness between about 2500 to 20,000 Angstroms.

23. The metal guard structures of claim 20, wherein said protection ring is comprised of copper.

* * * * *